(12) United States Patent
Kozlov et al.

(10) Patent No.: US 6,455,175 B1
(45) Date of Patent: Sep. 24, 2002

(54) ELECTROLESS RHODIUM PLATING

(75) Inventors: Alexander S. Kozlov, Wharton; Thirumalai Palanisamy, Morristown; Dave Narasimhan, Flemington, all of NJ (US)

(73) Assignee: Honeywell International Inc., Morristown, NJ (US)

( * ) Notice: Subject to any disclaimer, the term of this patent is extended or adjusted under 35 U.S.C. 154(b) by 9 days.

(21) Appl. No.: 09/611,184

(22) Filed: Jul. 6, 2000

(51) Int. Cl.[7] ................. B32B 15/00; C23C 18/16; C23C 18/44
(52) U.S. Cl. ............. 428/670; 427/98; 427/126.5; 427/443.1; 106/1.24; 106/1.21
(58) Field of Search ............ 428/670; 427/98, 427/126.5, 443.1; 106/1.24, 1.21

(56) References Cited

U.S. PATENT DOCUMENTS

| | | | |
|---|---|---|---|
| 3,486,928 A | * 12/1969 | Rhoda et al. | |
| 3,562,911 A | 2/1971 | Walter et al. | ............ 32/8 |
| 4,285,784 A | 8/1981 | Flinn et al. | ............ 204/39 |
| 4,361,602 A | 11/1982 | Torikai et al. | ............ 427/123 |
| 5,980,345 A | * 11/1999 | Chang et al. | |

FOREIGN PATENT DOCUMENTS

| | | |
|---|---|---|
| DE | 2607988 A1 | 8/1977 |
| JP | 204168-1983 | 11/1983 |
| JP | 80764-1984 | 5/1984 |
| SU | 1212954 | * 2/1986 |

OTHER PUBLICATIONS

Griffith, William, Et Al "Gmelin Handbook of Inorganic Chemistry", Springer–Verlag; 1984; pp. 126–127; 152–153 No Month.

Lowenheim, Frederick, A.; "Modern Electroplating"; John Wiley, and Sons; pp. 710; 720–721 No Date.

* cited by examiner

Primary Examiner—Deborah Jones
Assistant Examiner—Jason Savage
(74) Attorney, Agent, or Firm—Kris T. Fredrick

(57) ABSTRACT

An composition for electroless plating of rhodium onto a substrate, a process for plating a uniform coating of rhodium onto various substrates using an electroless plating composition, and a rhodium plated article formed therefrom. The plating composition is an aqueous solution of triamminetris(nitrito-N,N,N)rhodium(III); ammonium hydroxide; and hydrazine hydrate.

23 Claims, No Drawings

ELECTROLESS RHODIUM PLATING

BACKGROUND OF THE INVENTION

1. Field of the Invention

The present invention relates to electroless plating of rhodium onto a substrate. More particularly, this invention pertains to an aqueous rhodium plating bath, a process for plating a uniform coating of rhodium onto various substrates using an electroless plating composition, and a rhodium plated article formed therefrom.

2. Description of the Related Art

Plating of metals is a well known process employed to alter the existing surface properties or dimensions of a substrate. For example, a substrate may be plated for decorative purposes, to improve resistance to corrosion or abrasion, or to impart desirable electrical or magnetic properties to a substrate. Plating is a common practice in many industries, including the manufacture of a variety of electronic packaging substrates, such as printed circuit boards.

There are various methods of plating known in the art, including electroplating and electroless plating. Electroplating involves the formation of an electrolytic cell wherein a plating metal represents an anode and a substrate represents a cathode, and an external electrical charge is supplied to the cell to facilitate the coating the substrate.

Rhodium is employed as a thin coating on substrates, in electronics, optics, fuel cells, electrical contacts, automotive catalysts, gas sensors, corrosion protection, insoluble electrodes, gas turbine engines, X-ray mirrors, supported catalysts, jewelry, medical implants and many other applications. Metallic rhodium (Rh) provides the unique combination of excellent physical and chemical properties such as hardness, wear resistance, corrosion resistance, electrical and thermal conductivity, optical reflectance, catalytic activity and others.

Rhodium coatings are typically deposited by electroplating, vacuum deposition (sputtering), or chemical vapor deposition (CVD) techniques. Vacuum deposition of rhodium coating is expensive, requires complicated equipment and cannot be done uniformly on geometrically complicated substrates. Deposition of rhodium coating by the CVD process is expensive, requires complicated equipment and cannot be done on temperature sensitive substrates like electronic components or polymer membranes for fuel cells because of the CVD method requires thermal decomposition of vapors of rhodium chemical compounds on substrate surface at 200+° C.). CVD rhodium coatings are contaminated with 2–35% carbon. (See A. Etspuler, et al., "Deposition Of Thin Rhodium Films By Plasma-Enhanced Chemical Vapor Deposition", Appl. Phys., A, 1989, v. 48, pp. 373–375). Also, deposition of CVD coatings on powders is not easy.

Rhodium electroplating is carried out from highly acidic sulfuric or phosphoric electrolytes (See R. Morrissey, "Rhodium Plating", Plating and Surface Finishing 1999, v. 86, No. 11, p. 62; and Modem Electroplating, Edited by F. Lowenheim, John Wiley & Sons, NY, 1974, pp. 350–352). Electrically non-conductive substrates like polymer membranes for fuel cells and ceramic monolithic supports for automotive catalysts cannot be plated. Non-precious metals can be properly plated only after pre-plating with nickel or precious metals because of high acidity of rhodium electrolyte. Geometrically complicated substrates cannot be uniformly plated because of poor distribution of current density in the rhodium electrolyte. Plating on powders is practically not available. Also, sulfur and phosphorus from the electrolyte contaminate an electroplated rhodium coating. Rhodium purity is critical for a number of applications like corrosion protection and catalysis. It has been shown that the presence of 0.01–0.001% sulfur and phosphorus and chlorine in a noble metal corrosion protective coating reduces its protective action and the lifetime of gas turbine components by 25% (See U.S. Pat. No. 5,788,823).

Electroless plating involves the deposition of a metallic coating from an aqueous bath onto a substrate by a controlled chemical reduction reaction which is catalyzed by the metal or alloy being deposited or reduced. This process differs from electroplating in that it requires no external electrical charge. One attractive benefit of electroless plating over electroplating is the ability to plate a substantially uniform metallic coating onto a substrate having an irregular shape. Frequently, electroplating an irregularly shaped substrate produces a coating having a non-uniform deposit thickness because of varying distances between the cathode and anode of the electrolytic cell. Electroless plating obviates this problem by excluding the electrolytic cell. Another benefit of electroless plating over electroplating is that electroless plating is autocatalytic and continuous once the process is initiated, requiring only occasional replenishment of the aqueous bath. Electroplating requires an electrically conductive cathode and continues only while an electric current is supplied to the cell. Also, electroless coatings are virtually nonporous, which allows for greater corrosion resistance than electroplated substrates.

In general, an electroless plating bath includes water, a water soluble compound containing the metal to be deposited onto a substrate, a complexing agent that prevents chemical reduction of the metal ions in solution while permitting selective chemical reduction on a surface of the substrate, and a chemical reducing agent for the metal ions. Additionally, the plating bath may include a buffer for controlling pH and various optional additives, such as bath stabilizers and surfactants. The composition of a plating bath typically varies based on the particular goals of the plating process. For example, U.S. Pat. No. 6,042,889, teaches an electroless plating bath and having a hypophosphite reducing agent and employing one of several different "mediator ions", including rhodium ions, for the purpose of converting a non-autocatalytic metal-reduction reaction into an autocatalytic reaction to plate a substrate with copper.

Rhodium exhibits good hardness, catalytic, friction and wear properties, but present application techniques are very expensive. Known efforts to plate rhodium onto substrates have been difficult because of problems in producing a pure metallic rhodium coating on a substrate and undesirable degradation of the aqueous bath.

U.S. Pat. No. 4,361,602, teaches a process for electroless plating of rhodium onto a substrate using a aqueous composition, or plating bath, comprising a rhodium salt, a nickel salt as an activating agent and an alkylamine borane wherein the molar ratio of nickel salt to rhodium salt ranges from 0.01 to 2.0.

The disclosed process uses rhodium as a chloride, bromide, perchlorate or a sulfate. This process is disadvantageous in that the presence of nickel, boron, carbon or chloride in the plating bath are non-volatile compounds that lead to impure rhodium plating. Also, the accumulation of non-volatile byproducts and non-consumable elements from the plating bath inhibit replenishment of the plating bath, leading to undesirable termination of the plating process.

Japanese patent JP58204168, teaches a process for electroless plating of rhodium onto a substrate using an aqueous plating bath comprising a rhodium as a chloride, hydroxyl amine salt as a stabilizer and hydrazine as a reducing agent. This process is also disadvantageous because the accumulation of non-volatile chloride byproducts and non-consumable elements from the plating bath lead to an impure rhodium plating and inhibit replenishment of the plating bath, leading to termination of the plating process. Additionally, Swiss patent CH 606475 and German patent DE 2607988 teach a process for electroless plating of rhodium with similar problems resulting from non-volatile chloride and sodium byproducts.

The present invention solves the problems of the prior art by employing a process for electroless plating of rhodium using a composition comprising an aqueous solution comprising a rhodium ammine nitrite salt, ammonium hydroxide as a complexing agent and hydrazine hydrate as a reducing agent. The composition of this aqueous solution is free of non-volatile components that cause impure plating, allowing for improved appearance and properties of the plated rhodium. Further, the process generates essentially no hazardous substances and the absence of non-volatile components avoids the accumulation of byproducts that degrade the plating bath, allowing for virtually unlimited replenishment of the bath. Moreover, the unique composition of the plating bath allows metallic rhodium to be precipitated from the plating bath by boiling without undesirable contaminants.

This invention provides a simple low-cost method of a deposition of ultra pure rhodium coatings on virtually any material of any geometrical shape, including fibers and powders, by electroless autocatalytic plating. The method involves the controlled autocatalytic chemical reduction of a rhodium salt by a chemical reducer with the formation of a dense uniform metallic rhodium coating of unlimited thickness selectively on the substrate surface which is contacted with a rhodium plating bath.

SUMMARY OF THE INVENTION

The invention provides an electroless plating composition comprising an aqueous solution comprising:
  i) triamminetris(nitrito-N,N,N)rhodium(III);
  ii) ammonium hydroxide; and
  iii) hydrazine hydrate.

The invention further provides a process for plating a substrate comprising:
  a) providing a plating composition comprising an aqueous solution comprising:
    i) triamminetris(nitrito-N,N,N)rhodium(III);
    ii) ammonium hydroxide; and
    iii) hydrazine hydrate; and
  b) contacting a substrate with the plating composition for a sufficient time and under conditions sufficient to plate metallic rhodium onto the substrate.

The invention also provides a process for plating a substrate comprising:
  a) providing a plating composition comprising an aqueous solution comprising:
    i) triamminetris(nitrito-N,N,N)rhodium(III);
    ii) ammonium hydroxide; and
    iii) hydrazine hydrate;
  b) immersing a substrate into the plating composition for a sufficient time and under conditions sufficient to plate metallic rhodium onto the substrate; and
  c) removing the substrate from the plating composition.

The invention further provides an article comprising a substrate immersed in a composition comprising an aqueous solution comprising:

i) triamminetris(nitrito-N,N,N)rhodium(III);
  ii) ammonium hydroxide; and
  iii) hydrazine hydrate.

DETAILED DESCRIPTION OF THE PREFERRED EMBODIMENT

The present invention provides a process for uniformly plating various substrates with metallic rhodium using an electroless plating bath. Initially, an aqueous plating bath comprising water, triamminetris(nitrito-N,N,N)rhodium (III), ammonium hydroxide and hydrazine hydrate is formed in a suitable container. Triamminetris(nitrito-N,N,N) rhodium(III), CAS Registry Number 102129-82-8, can be formed, for example, by reacting $K_3[Rh(NO_2)_3Cl_3]$ with ammonia ($NH_4$). The preferred complexing agent is ammonium hydroxide ($NH_4OH$). The preferred complexing agent is a 28% solution of ammonium hydroxide. The preferred reducer is a hydrazine compound, most preferably hydrazine hydrate ($N_2H_4 \cdot H_2O$). Other suitable hydrazines include hydrazine chloride and hydrazine sulfate, but are not preferred because of the greater probability that rhodium will precipitate out of the bath. Accordingly, the preferred plating bath can be described by the following general formula:

$[Rh(NH_3)_3(NO_2)_3] + 0.75\ N_2H_4 \cdot H_2O = Rh + 3.75\ N_2 + 6.75\ H_2O$

The amount of the triamminetris(nitrito-N,N,N)rhodium (III) present in the bath preferably ranges from about 0.01 to about 320 g/L. More preferably, the amount of triamminetris (nitrito-N,N,N)rhodium(III) ranges from about 0.01 to about 5 g/L. The amount of 28% ammonium hydroxide present in the bath preferably ranges from about 1–1000 mL/L, more preferably from about 10 to about 500 mL/L. The preferred amount of hydrazine hydrate present ranges from about 0.01 to about 240 g/L, more preferably from about 0.1 to about 10 g/L.

Once all of the components are combined in a suitable container, the water soluble triamminetris(nitrito-N,N,N) rhodium(III) dissolves, releasing rhodium ions into the bath. The ammonium hydroxide complexing agent forms a strong complex with the rhodium ions and prevents chemical reduction of the rhodium ions in the bath while permitting selective chemical reduction on a substrate surface. The hydrazine hydrate reducer allows reduction of the complex rhodium ions at the substrate surface. In particular, after a substrate is immersed in the plating bath, the substrate surface catalyzes oxidation of the reducing agent. This oxidation causes a release of electrons that, in turn, reduce metal rhodium ions in the bath at the substrate surface. These reduced metal ions are then deposited onto the substrate and, over time, generate a metal shell around the substrate. The hydrazine hydrate reducer allows reduction of the complex rhodium ions to metallic rhodium which is deposited selectively on a substrate surface because of a catalytic action of a substrate surface. Chemical reduction of the triamminetris (nitrito-N,N,N)rhodium(III) by hydrazine hydrate results in the formation of only metallic rhodium and highly volatile gaseous byproducts ($N_2$, $H_2O$ and $NH_3$) which are removed from the plating bath by evaporation. Other bath constituents, including $N_2H_4 \cdot H_2O$, are also highly volatile and can be similarly removed through evaporation. The bath contains no substances capable of accumulating in the container and suppressing the rhodium plating process, and creates no hazardous substances. The plating composition is highly stable and does not require the addition of non-volatile stabilizers, accelerators, pH regulators or other chemical agents used to enhance plating properties. Also, because no strong complexing agents are included or generated by the bath, simple boiling of the bath is sufficient to precipitate virtually pure rhodium from the aqueous solution.

The process is autocatalytic, in that no catalyst separate from the aforementioned components is required to advance the rhodium deposition on a catalytically active surface like base and noble metals, alloys, graphite and others. Catalytically inactive materials like glass, ceramics and polymers can be activated by conventional methods, for instance by contacting with a tin salt solution and/or a noble metal solution. Additionally, the process is continuous and may be maintained for virtually an infinite time by merely replenishing each of the components of the bath.

The bath is maintained at a temperature ranging from about 20° C. to about 98° C., more preferably from about 60° C. to about 90° C. The bath is also maintained at a preferred pH ranging from about 8 to about 13. Preferably, the bath is formed in the absence of any other additives since such would tend to accumulate in the bath. These conditions are important factors in maintaining a stable plating bath and preventing precipitation of rhodium from the bath.

Following formation of the plating bath, a suitable substrate is immersed in the bath for plating. The substrate remains in the plating solution for a time sufficient and under conditions sufficient to plate a substantially uniform coating of metallic rhodium of required thickness onto the substrate. Usually the plating rate is about 0.1 to 2 micron/h. It increases with increasing temperature and concentration of rhodium and hydrazine. Typically the substrate remains in the plating bath for from about 1 minute to about four hours depending on the required rhodium thickness preferably from about 5 minutes to about 60 minutes and most preferably from about 5 minutes to about 30 minutes . After the desired amount of metallic rhodium has been coated on the substrate, it is removed from the plating solution. The result is an article having a substantially uniform and virtually pure metallic rhodium plating, having good appearance and properties. Plating can also be done by contacting a substrate surface with a plating bath by any other technique such as spraying, pouring, brushing, etc. The substrate may comprise any material ranging from non-metals, metals, alloys, semiconductors and non-conductors. Suitable metal substrates include stainless steel, carbon steel, nickel, iron, chromium, iron-chromium alloys, and nickel-chromium-iron alloys. Suitable non-metals include printed circuit boards, polyimide substrates, ceramic and glass substrates.

The type of container used to form the plating bath is also an important factor affecting the stability of the bath. In particular, the container should be non-metallic to prevent reduction of the metal ions on the walls of the container. Additionally, means used to heat the bath should be a non-metallic heating system, and should heat the bath uniformly to prevent any reductions of metal ions in the bath.

The following non-limiting examples serve to illustrate the invention.

EXAMPLE 1

Triamminetris(nitrito-N,N,N)rhodium(III) $[Rh(NH_3)_3(NO_2)_3]$ was synthesized by reacting $K_3[Rh(NO_2)_3Cl_3]$ with ammonium hydroxide according to Gmelin, Handbook of Inorganic Chemistry, $8^{th}$ Edition, Rhodium, Supplement Volume B 2, System Number 64, Springer-Verlag, Berlin, 1984, p. 152. A sample of Ni foil 40×20×0.79 mm was cleaned by a sandpaper Grit 600 and immersed for 10 min. in an electroless rhodium plating bath containing 1 g/L rhodium as $[Rh(NH_3)_3(NO_2)_3]$, 200 mL/L $NH_4OH$ and 1 g/L $N_2H_4H_2O$ at 70° C. A dense bright uniform rhodium coating of 0.2 micrometers (micron) thick was obtained. This rhodium coating is useful for corrosion protection.

EXAMPLE 2

A sample of Inconel X750 foil 30×10×0.125 mm was cleaned by a sandpaper Grit 600 and immersed for 15 min. in an electroless rhodium plating bath containing 3.2 g/L rhodium as $[Rh(NH_3)_3(NO_2)_3]$, 50 mL/L NH4OH and 1.5 g/L $N_2H_4H_2O$ at 85° C. A dense bright uniform rhodium coating of 0.4 micron thick was obtained. This rhodium coating is useful for corrosion protection.

EXAMPLE 3

A sample of a stainless steel shaped support 50×25×4 mm was cleaned by acetone and immersed for 30 min. in an electroless rhodium plating bath containing 0.5 g/L rhodium as $[Rh(NH_3)_3(NO_2)_3]$, 500 mL/L $NH_4OH$ and 0.7 g/L $N_2H_4H_2O$ at 75 C. A dense bright uniform rhodium coating of 0.2 micron thick was obtained. This rhodium coating is useful as a supported catalyst.

EXAMPLE 4

A sample of a honeycomb cordierite ceramic monolith $Mg_2AL_4Si_5O_{18}$ 30×30×12 mm was degreased by a heat treatment at 550° C. for 30 min., sensitized by an immersion for 2 min. into 10 g/L tin chloride solution, and rinsed with water. It was then catalytically activated by an immersion for 2 min. into 1 g/L palladium chloride solution, rinsed with water and immersed for 30 min. in an electroless rhodium plating bath containing 5 g/L rhodium as $[Rh(NH_3)_3(NO_2)_3]$, 100 mL/L $NH_4OH$ and 2 g/L $N_2H_4H_2O$ at 60° C. A matte gray uniform rhodium coating of approximately 0.5 micron thick was obtained. This rhodium coating is useful as a supported catalyst.

EXAMPLE 5

5 g of silicon carbide powder SiC of 5–10 micron particle size was degreased with acetone, sensitized by an immersion for 2 min. into 10 g/L tin chloride solution, rinsed with water, catalytically activated by an immersion for 2 min. into 1 g/L palladium chloride solution, rinsed with water and stirred for 30 min. in an electroless rhodium plating bath containing 1 g/L rhodium as $[Rh(NH_3)_3(NO_2)_3]$, 100 mL/L $NH_4OH$ and 2.5 g/L $N_2H_4H_2O$ at 70° C. The obtained powder has a bright continuous rhodium coating of approximately 0.03 micron thick. This rhodium coating is useful as a supported catalyst.

EXAMPLE 6

A glass microscope slide 75×25×1 mm was cleaned by polishing with an aluminum oxide suspension, treated in ultrasonic cleaner, sensitized by an immersion for 2 min. into 10 g/L tin chloride solution, rinsed with water, catalytically activated by an immersion for 2 min. into 1 g/L palladium chloride solution, rinsed with water and immersed for 10 min. in an electroless rhodium plating bath containing 0.1 g/L rhodium as $[Rh(NH_3)_3(NO_2)_3]$, 200 mL/L $NH_4OH$ and 0.2 g/L $N_2H_4H_2O$ at 60° C. A bright mirror rhodium coating of approximately 0.1 micron thick was obtained. This rhodium coating is useful as a non-tarnishing mirror.

EXAMPLE 7

A sample of an alumina ceramics 25×25×1.5 mm having through-holes of 0.2 mm a diameter was degreased by a heat treatment at 550° C. for 30 min., sensitized by an immersion for 2 min. into 10 g/L tin chloride solution, rinsed with water, catalytically activated by an immersion for 2 min. into 1 g/L palladium chloride solution, rinsed with water and immersed for 2 hr. in an electroless rhodium plating bath containing 3 g/L rhodium as $[Rh(NH_3)_3(NO_2)_3]$, 100 mL/L $NH_4OH$ and 1.5 g/L $N_2H_4H_2O$ at 75° C. A matte gray uniform rhodium coating of 2.2 micron thick was obtained on the whole surface including the holes. Surface electrical resistance by the 2-point method is 0.3 Ohm/cm, which is close to that of bulk rhodium measured by the same method (0.2 Ohm/cm). Through-hole electrical resistance is 0.3 Ohm/cm. This rhodium coating is useful as an electronic packaging component.

EXAMPLE 8

An electroless rhodium plating bath containing 7 g/L rhodium as $[Rh(NH_3)_6](NO_2)_3$, 50 mL/L $NH_4OH$ and 4.5 g/L $N_2H_4H_2O$ was prepared by boiling 7 g/L rhodium as $[Rh(NH_3)_3(NO_2)_3]$ in 50 mL/L $NH_4OH$ for 6 hr. with the subsequent addition of 4.5 g/L $N_2H_4H_2O$. During the first hour of boiling, the initial rhodium salt $[Rh(NH_3)_3(NO_2)_3]$ is not completely dissolved, but dissolves completely after 6 hours of boiling.

A sample of titanium plate 50×25×0.89 mm was cleaned by sandpaper Grit 600, etched in 1:1 HCL at 80° C. for 10 min. and immersed for 3 hr. in electroless rhodium plating bath described above. Plating was carried out at 85–90° C. A dense semi-bright rhodium coating of 3.5 micron thick was obtained. This rhodium coating is useful as an insoluble electrode.

While the present invention has been particularly shown and described with reference to preferred embodiments, it will be readily appreciated by those of ordinary skill in the art that various changes and modifications may be made without departing from the spirit and scope of the invention. It is intended that the claims be interpreted to cover the disclosed embodiment, those alternatives which have been discussed above and all equivalents thereto.

What is claimed is:

1. An electroless plating composition comprising an aqueous solution comprising:
   i) triamminetris(nitrito-N,N,N)rhodium(III);
   ii) ammonium hydroxide; and
   iii) hydrazine hydrate.

2. The plating composition of claim 1 wherein the triamminetris(nitrito-N,N,N)rhodium(III) is present in an amount ranging from about 0.01 to about 320 g/L.

3. The plating composition of claim 1 wherein the triamminetris(nitrito-N,N,N)rhodium(III) is present in an amount ranging from about 0.01 to about 5 g/L.

4. The plating composition of claim 1 wherein ammonium hydroxide is present in an amount ranging from about 1 to about 1000 mL/L.

5. The plating composition of claim 1 wherein ammonium hydroxide is present in an amount ranging from about 10 to about 500 mL/L.

6. The plating composition of claim 1 wherein hydrazine hydrate is present in an amount ranging from about 0.01 to about 240 g/L.

7. The plating composition of claim 1 wherein hydrazine hydrate is present in an amount ranging from about 0.1 to about 10 g/L.

8. A process for plating a substrate comprising:
   a) providing a plating composition comprising an aqueous solution comprising:
      i) triamminetris(nitrito-N,N,N)rhodium(III);
      ii) ammonium hydroxide; and
      iii) hydrazine hydrate; and
   b) contacting a substrate with the plating composition for a sufficient time and under conditions sufficient to plate metallic rhodium onto the substrate.

9. The process of claim 8 wherein the plating composition is autocatalytic.

10. The process of claim 8 wherein the substrate is uniformly plated with metallic rhodium.

11. The process of claim 8 wherein the temperature of the plating composition ranges from about 20° C. to about 98° C.

12. The process of claim 8 wherein the temperature of the plating composition ranges from about 60° C. to about 90° C.

13. The process of claim 8 wherein the triamminetris (nitrito-N,N,N)rhodium(III) is present in the plating composition in an amount of from about 0.01 to about 320 g/L.

14. The process of claim 8 wherein ammonium hydroxide is present in the plating composition in an amount of from about 1 to about 1000 mL/L.

15. The process of claim 8 wherein hydrazine hydrate is present in the plating composition in an amount of from about 0.01 to about 240 g/L.

16. The process of claim 8 which is conducted without electrolysis.

17. The process of claim 8 wherein the substrate comprises a metal.

18. The process of claim 8 wherein the substrate comprises a non-metal.

19. The process of claim 8 wherein the substrate comprises a semiconductor.

20. The process of claim 8 wherein the substrate comprises a ceramic.

21. A plated substrate produced by the process of claim 8.

22. A process for plating a substrate comprising:
   a) providing a plating composition comprising an aqueous solution comprising:
      i) triamminetris(nitrito-N,N,N)rhodium(III);
      ii) ammonium hydroxide; and
      iii) hydrazine hydrate;
   b) immersing a substrate into the plating composition for a sufficient time and under conditions sufficient to plate metallic rhodium onto the substrate; and
   c) removing the substrate from the plating composition.

23. An article comprising a substrate immersed in a composition comprising an aqueous solution comprising:
   i) triamminetris(nitrito-N,N,N)rhodium(III);
   ii) ammonium hydroxide; and
   ii) hydrazine hydrate.

* * * * *